(12) United States Patent
De Steur et al.

(10) Patent No.: US 6,649,864 B2
(45) Date of Patent: Nov. 18, 2003

(54) METHOD OF LASER DRILLING

(75) Inventors: Hubert De Steur, Drongen (BE); Hans Juergen Mayer, Viernheim (DE); Otto Märten, Dreielch (DE); Christian Overmann, Karlsruhe (DE); Wei Pan, Zwinjinaarde Gent (BE); Eddy Roelants, Bruegge (BE); Martin Wehner, Herzogenrath (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/076,301

(22) Filed: Feb. 19, 2002

(65) Prior Publication Data

US 2003/0047544 A1 Mar. 13, 2003

(30) Foreign Application Priority Data

Sep. 13, 2001 (DE) .......................... 101 45 184

(51) Int. Cl.⁷ ............................................... B23K 26/00
(52) U.S. Cl. .............................. 219/121.71; 219/121.7; 219/121.72
(58) Field of Search ......................... 219/121.71, 121.7, 219/121.67, 121.72, 121.85, 121.78, 121.82

(56) References Cited

U.S. PATENT DOCUMENTS

| | | |
|---|---|---|
| 4,328,410 A | 5/1982 | Slivinsky et al. |
| 4,461,947 A | 7/1984 | Ward |
| 4,644,130 A | 2/1987 | Bachmann |
| 4,959,119 A * | 9/1990 | Lantzer ...................... 156/644 |
| 5,585,019 A | 12/1996 | Gu et al. |
| 5,910,255 A | 6/1999 | Noddin |
| 6,362,454 B1 * | 3/2002 | Liu .......................... 219/121.7 |
| 6,541,732 B2 * | 4/2003 | Hirose et al. ............ 219/121.7 |

FOREIGN PATENT DOCUMENTS

DE   2327567   1/1974

\* cited by examiner

*Primary Examiner*—M. Alexandra Elve
(74) *Attorney, Agent, or Firm*—Harness, Dickey & Pierce, P.L.C.

(57) ABSTRACT

In a method for the laser drilling of holes in a circuit substrate with the aid of a perforated mask, a laser beam is moved in the region of the perforated mask on a circular path. The center point of the region lies concentrically with respect to the set position of the respective hole in the mask. Further, the diameter of the region is smaller than the diameter of the hole. At the same time, the diameter of the laser beam spot is chosen to be large enough that it always covers the center point of the perforated mask during the circular motion. As a result, an energy distribution of the laser energy, which is as uniform as possible, is achieved in the region of the perforated mask.

19 Claims, 2 Drawing Sheets

METHOD OF LASER DRILLING

This application claims priority under 35 U.S.C. §119 on German patent application number DE 10145184.9 filed Sep. 13, 2001, the entire contents of which are hereby incorporated herein by reference.

FIELD OF THE INVENTION

The invention generally relates to a method of laser drilling of electrical circuit substrates. More preferably, it relates to a method wherein a laser beam is directed onto an intended portion of the substrate, preferably through a perforated mask close to the surface, in order to drill a hole with a predetermined hole diameter.

BACKGROUND OF THE INVENTION

The use of perforated masks when drilling holes, in particular also blind holes, in printed circuit boards and comparable substrates which serve as leadframes has long been known (U.S. Pat. No. 4,644,130A). The generally metallic perforated mask has apertures, which define by their configuration both the position and size of the holes to be drilled (known as the conformal mask). The metal layer which forms the mask, known as the proximity mask, is in this case placed on the surface of the substrate, directly in contact with its surface or at a small distance from it.

In U.S. Pat. No. 5,585,019A, a description is given of a laser machining method using a device in which it is ensured by the design of the optics for the laser beam that the laser beam always impinges on the substrate at the same angle, without the latter itself having to be moved. When drilling printed circuit boards with a perforated mask, the laser, usually a CO2 laser or a laser with comparable properties, is always pulsed on the same point via the perforated mask (known as punching). To achieve material removal which is as uniform as possible over the entire cross section of the hole during this operation, it is aimed to achieve for the laser beam an energy distribution which is as uniform as possible over the entire diameter of the hole, while lowest possible energy losses outside the edge of the hole are desired. The energy distribution is accordingly intended to have as far as possible a rectangular profile with steep flanks (top hat), to achieve an optimum effect. However, the forming of a laser beam of this type is very complex. It has previously been realized either by use of special optics (for example diffractive optics) or with diaphragms in an imaging system in the path of rays. However, such optics can only be produced in a very complex way, while diaphragms cause a large part of the laser power, often over 50%, to be lost. The imaging with a fixed scale ratio that is required in this case also makes the path of rays very long, and requires very large deflecting mirrors in the deflecting unit.

SUMMARY OF THE INVENTION

An aim of an embodiment of the present invention is to provide a method of drilling holes, preferably using a perforated mask. In one embodiment, it is an aim to dispense with special optics and diaphragms, and achieve a uniform removal of material in the hole with little loss of laser power.

According to an embodiment of the invention, an aim is achieved by a method wherein the laser beam is moved in the region of the hole to be drilled on a circular path. The center point of the region lies concentrically with respect to the set position of the respective hole and the diameter of the region is smaller than or equal to the diameter of the hole.

In one embodiment, the diameter of the laser beam spot is dimensioned such that it always covers the center point of the hole during the circular motion of the laser beam.

In a method according to an embodiment of the invention, the laser beam is consequently guided in what is known as a wobble motion on a circle within the hole, in such a way that at least the entire cross-sectional area of the hole is covered with each orbit. Further, the center point of the beam with the greatest energy density of the spot, follows an orbital path in the region between the center point or the set position of the center point and the edge. As such, the effective energy distribution is approximated to the desired rectangular shape.

On the basis of the energy distribution achieved according to an embodiment of the invention, it is also possible in principle to drill holes with adequate edge contours even without a perforated mask, in particular in organic or dielectric layers. A preferred embodiment of the invention may include the drilling of holes with the aid of perforated masks near the surface, with a metallization on the upper side of a (multilayer) printed circuit board preferably serving as the perforated mask, it likewise being possible for the holes in the perforated mask to be produced by laser drilling. In the case in which a perforated mask is used, a solution according to an embodiment of the invention is that the laser beam is moved in the region of the respective hole in the perforated mask on a circular path, the center point of which lies concentrically with respect to the set position of the respective hole in the mask and the diameter of which is smaller than or equal (at most equal to) to the diameter of the hole. Further, the diameter of the laser beam spot preferably always covers the center point of the hole in the mask during the circular motion of the laser beam, even in the case of a maximum permissible positional offset of the perforated mask.

To distribute the energy distribution as uniformly as possible over the circumference during the individual orbits of the laser beam, the laser beam is preferably guided in such a way that it always executes a whole number of complete circular orbits. The setting of the pulse energy of the laser is therefore chosen such that the total energy required for the drilling of the hole is distributed over a whole number of circular orbits of the laser beam.

A CO2 laser with high pulse frequencies, that is with repetition frequencies of 20 kHz to over 100 kHz, is preferably used for the method according to the invention, so that no time loss occurs in comparison with conventional methods. Small pulse widths of the order of magnitude of less than 500 ns, but typically ≦150 ns, have the effect that the laser still has an adequate pulse power at these high repetition frequencies.

BRIEF DESCRIPTION OF THE DRAWINGS

The invention is explained in more detail below on the basis of exemplary embodiments with reference to drawings, in which.

DETAILED DESCRIPTION OF THE PREFERRED EMBODIMENTS

Figure 1:
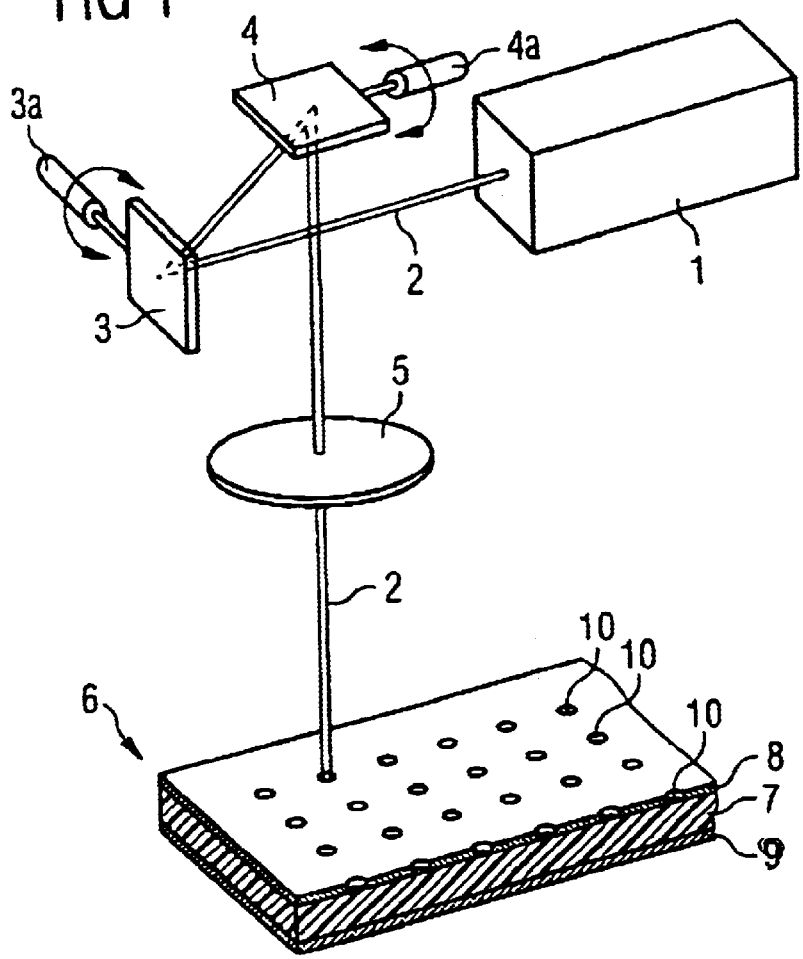
FIG. 1 shows the schematic arrangement of a laser and a substrate with a perforated mask for carrying out the method according to an embodiment of the invention.
Figure 2:
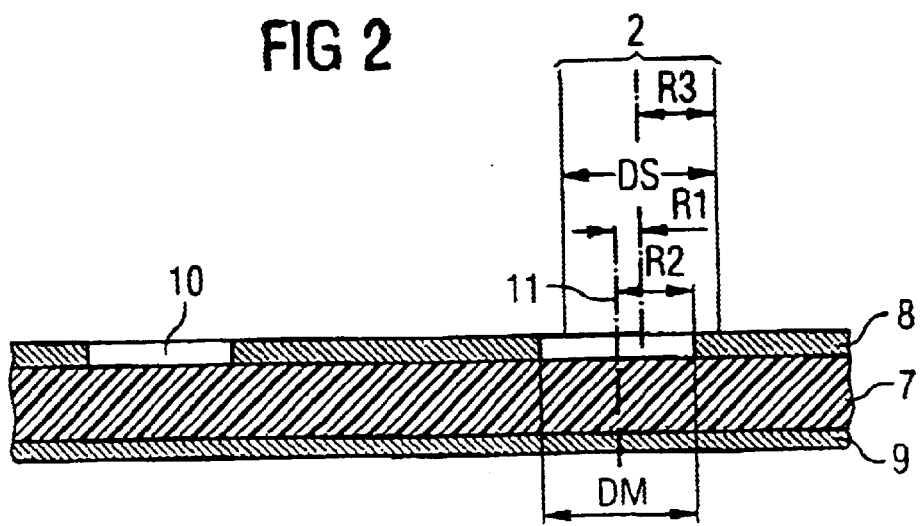
FIG. 2 shows a section through a substrate with a perforated mask and a laser beam in schematic representation.

In FIG. 1, an embodiment including an arrangement of a laser as used for the drilling of holes by use of a perforated mask is shown in principle. The laser source 1 emits a pulsed laser beam 2, which is deflected at a galvanometer unit with two mirrors 3 and 4, which can be pivoted about different axes. It is then focused by using an imaging system, in the present example a telecentric lens 5, in such a way that the beam 2 impinges with a predetermined spot width on a substrate or a printed circuit board 6. The printed circuit board has a dielectric layer 7, which is located between two metal layers 8 and 9. In this case, the upper metal layer 8 serves as a perforated mask. For this purpose, the mask is provided with holes 10, which have been produced beforehand in a known way, for example also by laser drilling or by etching. Instead of the metal layer 8 solidly bonded to the dielectric layer 7, however, a loosely placed-on perforated mask in the form of a foil or the like could also be used. By appropriate control of the mirrors 3 and 4 with the aid of very fast galvanometers 3a and 4a, the laser beam 2 can respectively be deflected onto one of the holes 10, to produce a hole of the same diameter in the dielectric layer 7. Blind holes which end at the lower metal layer 9 are preferably drilled in this way.

Since the energy distribution of the laser beam is not distributed uniformly over the entire spot diameter, according to an embodiment of the invention the laser beam is "wobbled" in the region of the respective hole 10. In other words, the pulsed beam is moved very rapidly in a circle, the center point M of which coincides with the center axis 11 of the hole in its set position, the radius R1 of the circle being smaller in the present case than the radius R2 of the hole 10. The spot diameter DS is generally of the same order of magnitude as the hole diameter DM (=2×R2) of the perforated mask, it also being possible for it to be approximately 10–20% larger or smaller than the latter. In the case of hole diameters of 200 µm, the spot diameter can consequently lie, for example, between 180 and 220 µm; in the case of smaller hole diameters, the spot diameter will tend to lie at the lower limit of this range (180 µm) or even below it. The circle diameter for the "wobbling" (circle-punching) of the laser beam can then be chosen such that an energy distribution which is as rectangular as possible (top hat) is produced, which is optimal for the corresponding perforated mask. It is even possible to compensate for positional tolerances of the perforated masks, by varying the circle diameter. Generally, a complete circle is always covered by the laser beam, i.e. the number of necessary pulses for the desired depth of the hole and the circle diameter R1 determine the distance from one pulse to the next on the circular path.

Figure 3:
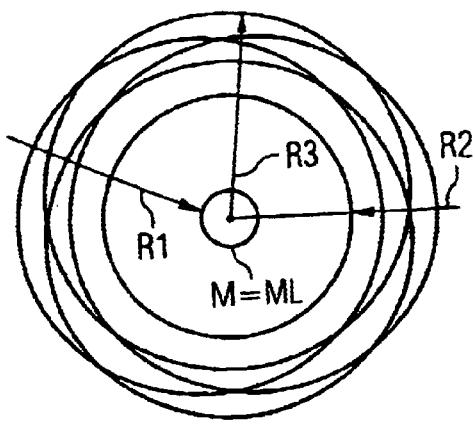
FIG. 3 shows a hole of a perforated mask in plan view with the schematically represented spot diameters of a number of impinging laser pulses.

FIG. 3 shows an example of the superposing of the various laser pulses over the hole of a perforated mask, to be precise for the case in which the perforated mask is precisely in its set position for example. The hole of the perforated mask is identified by the center point ML and the radius R2; it has in the example a diameter of 120 µm, that is R2=60 µm. The laser beam with a spot diameter of 180 µm, i.e. with a radius R3=90 µm, is moved in a circle with the radius R1=25 µm. In FIG. 3, only the positions of four laser pulses superposed on one another are shown. The actual number of pulses depends on how much energy is required for drilling the complete hole in the substrate.

Figure 4:
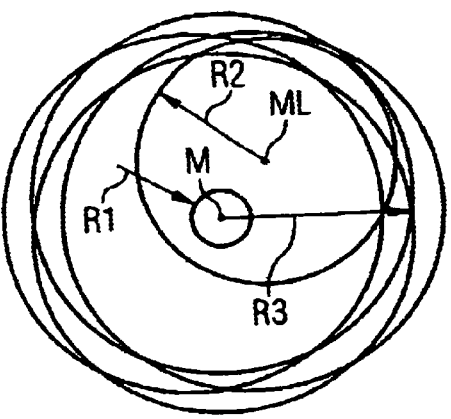
FIG. 4 shows a representation corresponding to FIG. 3, the perforated mask having a positional tolerance with respect to its set position

FIG. 4 shows a second example, it being assumed in the modification with respect to FIG. 3 that the hole 10 has a positional offset of 25 µm in the x direction and of 25 µm in the y direction with its center point ML of the perforated mask 8 with respect to the center point M of the set position. The radii R1 for the wobble circle, R2 for the hole of the mask and R3 for the laser spot have the same size as in FIG. 3. In this case, too, a largely uniform energy distribution can be achieved for the drilling of the hole in spite of the offset of the perforated mask.

Figure 5:
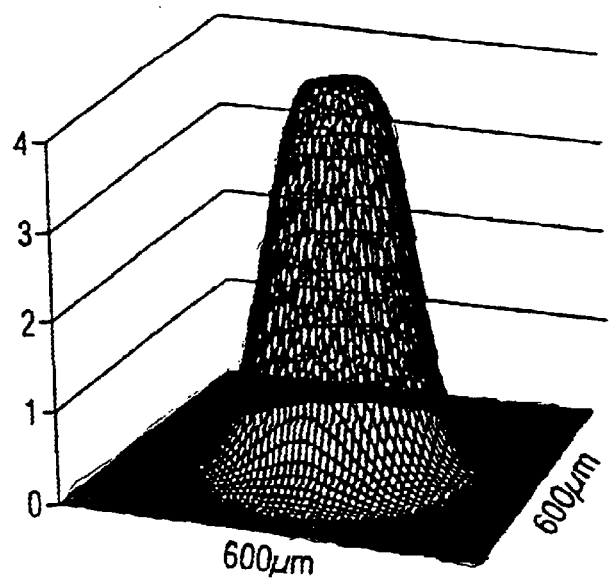
FIG. 5 shows the representation of an energy profile which can be achieved by the invention by simulation of individual beams.

In FIG. 5, a simulation of an energy distribution such as that which can be achieved with the method according to an embodiment of the invention is shown. In this case, eleven individual beams with a spot diameter of 200 µm, which are moved in a double circle of 150 µm in diameter, are shown. The image detail in this case is 600 µm×600 µm.

In the case of the method according to an embodiment of the invention, a very good, approximately rectangular energy distribution of the effective laser energy can consequently be achieved by a combination of rapid activation of the galvano mirrors and a Q-switched $CO_2$ laser with high pulse frequency, it being possible to use relatively small deflecting mirrors. This allows a high throughput to be achieved; at the same time, allowance is also made for positional tolerances.

The orbiting speed of the laser beam depends on the diameter of the hole, on the pulse frequency and on the respectively required number of pulses. For example, in a dielectric of RCC (Resin Coated Copper), holes of approximately 150 µm in diameter were drilled with a GEM-100 laser of the manufacturer COHERENT. In this case, the laser beam was guided in a wobble diameter of 100 µm with a repetition frequency of 100 kHz. It transpired that 10 pulses were required for drilling each of the holes, resulting in an orbiting speed of the laser beam of 3 m/s.

For the drilling of the same holes in FR4, 40 pulses at 60 kHz were required, resulting in an orbiting speed of the laser beam of approximately 470 mm/s.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of laser drilling of an electrical circuit substrate, comprising:

directing a laser beam onto a portion of the substrate to be drilled; and moving the laser beam in a region of a hole to be drilled on a circular path, a center point of the region lying concentrically with respect to a set position of the hole to be drilled and a diameter of the region being at most equal to a diameter of the hole, wherein the diameter of the laser beam always covers the center point of the hole during the circular motion of the laser beam, wherein the laser beam is directed onto a portion of the substrate to be drilled through a perforated mask, proximate to the substrate surface and including a predetermined hole diameter, and, wherein the laser beam is moved in the region of a respective hole in the perforated mask on a circular path, the center point of which lies concentrically with respect to the set position of the hole respectively to be drilled, and the diameter of which is at most equal to the diameter of the hole.

2. The method of claim 1, wherein the diameter of the laser beam spot always covers the center point of the hole in the perforated mask during the circular motion of the laser beam, even in the case of a maximum permissible positional offset of the perforated mask.

3. A method of laser drilling of an electrical circuit substrate, comprising:

directing a laser beam onto a portion of the substrate to be drilled; and moving the laser beam in a region of a hole to be drilled on a circular path, a center point of the region lying concentrically with respect to a set position of the hole to be drilled and a diameter of the region being at most equal to a diameter of the hole, wherein the diameter of the laser beam always covers the center point of the hole during the circular motion of the laser beam, wherein a circle diameter of the circular path corresponds at least to one eighth of the hole diameter and at most to the hole diameter.

4. The method as claimed in claim 2, wherein a circle diameter of the circular path corresponds at least to one eighth of the hole diameter and at most to the hole diameter.

5. The method as claimed in claim 3, wherein the circle diameter is between one quarter and half the hole diameter.

6. The method as claimed in claim 4, wherein the circle diameter is between one quarter and half the hole diameter.

7. The method as claimed in claim 1, wherein the perforated mask is formed by a metal layer adhering on the surface of the printed circuit board.

8. The method as claimed in claim 1, wherein the perforated mask is formed by a metal foil arranged on the printed circuit board.

9. The method as claimed in claim 2, wherein the spot diameter of the laser beam is at least one of greater than the hole diameter by up to 20% and smaller than the hole diameter by up to 20%.

10. The method as claimed in claim 3, wherein the spot diameter of the laser beam is at least one of greater than the hole diameter by up to 10% and smaller than the hole diameter by up to 10%.

11. The method as claimed in claim 2, wherein the laser beam is produced by a CO2 laser.

12. The method as claimed in claim 2, wherein the laser is used with a pulse width of less than 500 ns.

13. The method as claimed in claim 2, wherein the laser is used with a pulse width of at most equal to 150 ns.

14. The method as claimed in claim 2, wherein the perforated mask is formed by a metal layer adhering on the surface of the printed circuit board.

15. The method as claimed in claim 2, wherein the perforated mask is formed by a metal foil arranged on the printed circuit board.

16. A method of laser drilling of an electrical circuit substrate, comprising:

directing a laser beam onto a portion of the substrate to be drilled; and moving the laser beam in a region of a hole to be drilled on a circular path, a center point of the region lying concentrically with respect to a set position of the hole to be drilled and a diameter of the region being at most equal to a diameter of the hole, wherein the diameter of the laser beam always covers the center point of the hole during the circular motion of the laser beam, wherein the spot diameter of the laser beam is at least one of greater than the hole diameter by up to 20% and smaller than the hole diameter by up to 20%.

17. A method of laser drilling of an electrical circuit substrate, comprising:

directing a laser beam onto a portion of the substrate to be drilled; and moving the laser beam in a region of a hole to be drilled on a circular path, a center point of the region lying concentrically with respect to a set position of the hole to be drilled and a diameter of the region being at most equal to a diameter of the hole, wherein the diameter of the laser beam always covers the center point of the hole during the circular motion of the laser beam, wherein the spot diameter of the laser beam is at least one of greater than the hole diameter by up to 10% and smaller than the hole diameter by up to 10%.

18. A method of laser drilling of an electrical circuit substrate, comprising:

directing a laser beam onto a portion of the substrate to be drilled; and moving the laser beam in a region of a hole to be drilled on a circular path, a center point of the region lying concentrically with respect to a set position of the hole to be drilled and a diameter of the region being at most equal to a diameter of the hole, wherein the diameter of the laser beam always covers the center point of the hole during the circular motion of the laser beam, wherein the laser beam is directed onto a portion of the substrate to be drilled through a perforated mask, proximate to the substrate surface and including a predetermined hole diameter, wherein the laser beam is moved in the region of a respective hole in the perforated mask on a circular path, the center point of which lies concentrically with respect to the set position of the hole respectively to be drilled, and the diameter of which is at most equal to the diameter of the hole, wherein the laser beam is produced by a CO2 laser, and wherein the laser includes a repetition frequency of at least 20 kHz.

19. The method of claim 18, wherein the laser includes a repetition frequency of approximately 100 kHz±10%.

* * * * *